(12) United States Patent
Jaskari et al.

(10) Patent No.: US 10,123,455 B2
(45) Date of Patent: Nov. 6, 2018

(54) LIQUID COOLING ARRANGEMENT

(71) Applicant: VACON OYJ, Vaasa (FI)

(72) Inventors: Jukka Jaskari, Vaasa (FI); Osmo Miettinen, Vaasa (FI); Stefan Strandberg, Vörå (FI)

(73) Assignee: VACON OY, Vaasa (FI)

( * ) Notice: Subject to any disclaimer, the term of this patent is extended or adjusted under 35 U.S.C. 154(b) by 600 days.

(21) Appl. No.: 14/244,098

(22) Filed: Apr. 3, 2014

(65) Prior Publication Data

US 2014/0305611 A1  Oct. 16, 2014

(30) Foreign Application Priority Data

Apr. 11, 2013  (FI) .................................. 20134090 U

(51) Int. Cl.
*B60H 1/00* (2006.01)
*H05K 7/20* (2006.01)

(52) U.S. Cl.
CPC ..... *H05K 7/20281* (2013.01); *H05K 7/20272* (2013.01); *H05K 7/20927* (2013.01)

(58) Field of Classification Search
CPC ........... H05K 7/20927; H05K 7/20645; H05K 7/20263; H05K 7/20281; H05K 7/20218; H05K 7/20254; H05K 7/20272; F28F 3/12; F28F 9/026; F28D 2021/0029; H01L 23/4735
USPC ....................................................... 165/80.4
See application file for complete search history.

(56) References Cited

U.S. PATENT DOCUMENTS

| | | | | |
|---|---|---|---|---|
| 4,698,728 A * | 10/1987 | Tustaniwskyj | ..... | H05K 7/20272 165/104.31 |
| 5,115,225 A * | 5/1992 | Dao | ..... | G11B 33/144 340/584 |
| 5,278,495 A * | 1/1994 | Beaton | ..... | G01N 3/60 165/80.4 |
| 5,435,379 A * | 7/1995 | Moslehi | ..... | F04B 23/028 165/80.4 |
| 6,215,682 B1 * | 4/2001 | Akamatsu | ..... | H01L 23/473 257/E23.098 |
| 6,360,559 B1 * | 3/2002 | Midorikawa | ..... | H05K 7/20272 165/104.33 |
| 6,808,016 B2 * | 10/2004 | Wu | ..... | F28D 5/02 165/115 |
| 8,937,810 B2 * | 1/2015 | Brunschwiler | ..... | H05K 7/20772 165/104.33 |
| 9,069,532 B2 * | 6/2015 | Campbell | ..... | H05K 7/2029 |

(Continued)

*Primary Examiner* — Claire Rojohn, III
(74) *Attorney, Agent, or Firm* — Birch, Stewart, Kolasch & Birch, LLP

(57) ABSTRACT

Arrangement for cooling, with liquid, one or more electrical devices or structural units of an electrical device that is/are in at least one installation enclosure. A main channeling includes two channels, for distributing the liquid to the electrical devices to be cooled or to the structural units of the electrical devices, a liquid container, which is connected to one of the main channels directly and to the other main channel via a suction channel a pump and a heat exchanger, and also a shut-off valve. The liquid container is disposed below the electrical devices to be cooled or their structural elements, and the amount of liquid to be contained in the arrangement is configured to be such the ends of both the suction channel and the return channel that are inside the liquid container are always situated below the liquid surface.

14 Claims, 1 Drawing Sheet

(56) References Cited

U.S. PATENT DOCUMENTS

Figure 1:
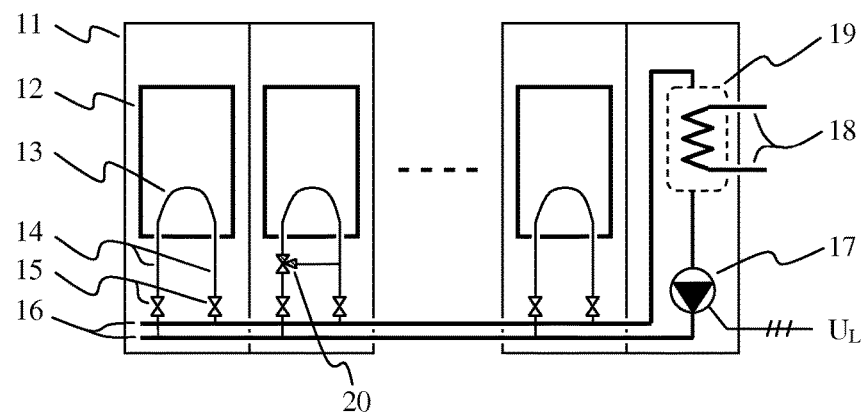

| | | | | |
|---|---|---|---|---|
| 9,078,379 B2* | 7/2015 | Campbell | .......... | H05K 7/20309 |
| 2003/0024692 A1* | 2/2003 | Wu | .......... | F25B 39/04 |
| | | | | 165/115 |
| 2005/0279115 A1* | 12/2005 | Lee | .......... | F24F 1/0007 |
| | | | | 62/314 |
| 2006/0286493 A1* | 12/2006 | Abrahamsson | .......... | B08B 9/0321 |
| | | | | 431/3 |
| 2009/0301112 A1* | 12/2009 | Nelson | .......... | F01K 25/106 |
| | | | | 62/112 |
| 2012/0199311 A1* | 8/2012 | Campbell | .......... | H05K 7/20781 |
| | | | | 165/11.1 |
| 2013/0027878 A1* | 1/2013 | Campbell | .......... | H05K 7/2029 |
| | | | | 361/694 |
| 2014/0290305 A1* | 10/2014 | Kunze | .......... | F25B 17/02 |
| | | | | 62/476 |
| 2014/0305611 A1* | 10/2014 | Jaskari | .......... | H05K 7/20927 |
| | | | | 165/11.1 |
| 2016/0341453 A1* | 11/2016 | Yamashita | .......... | F25B 13/00 |
| 2017/0105313 A1* | 4/2017 | Shedd | .......... | H05K 7/20272 |
| 2017/0150649 A1* | 5/2017 | Chester | .......... | H05K 7/20281 |
| 2018/0084676 A1* | 3/2018 | Edwards | .......... | F04D 29/586 |

* cited by examiner

LIQUID COOLING ARRANGEMENT

FIELD OF TECHNOLOGY

The object of this invention is an arrangement for cooling, with liquid, electrical devices, such as frequency converters, that require forced cooling.

PRIOR ART

The general development trend of power electronics devices, such as frequency converters, is an increase in power density. It is known in the art that the handling of high power in a small-sized device requires effective cooling of the components disposed on the pathway of the main current, which best succeeds with liquid cooling, i.e. by transferring the heat caused by the dissipation power produced in the components by the aid of a liquid flow to outside the device. For reasons of cost, liquid cooling is most often used only in high-powered devices, e.g. in frequency converters of over 100 kW.

High-powered devices requiring forced cooling are generally disposed in equipment enclosures, which can be arranged in e.g. the electrical equipment rooms of an industrial plant in such a way that the enclosures belonging to the same device entity are side-by-side in the same row. When cooling with liquid it is normal procedure in this type of situation to arrange a pumping station common to a number of enclosures that require cooling, which pumping station circulates cooling liquid via the enclosures to a common heat exchanger, via which heat is transferred onwards to outside the electrical equipment room.

The piping structure required by enclosure-specific liquid circulation is long and the flow circulating in it must be sufficiently strong to ensure cooling power for all the devices. A large pressure loss results with economic cross-sectional areas of piping, which loss the pump must, of course, be able to overcome. Since the power of the pump is proportional to the flow and to the rise in pressure, high-powered, and therefore also expensive, pumps are generally needed in enclosure-specific cooling.

The high pressure of the piping and the functioning of the valves belonging to the system increase the danger of a liquid leak in seals and pipe joints.

Air bubbles that have possibly remained in the liquid circulation can impede circulation of the liquid and thus effective cooling, for which reason it is important to get the air removed from the internal liquid channels of the devices to be cooled. For this so-called venting, so-called venting screws can be arranged in the devices or the internal channeling can be arranged to be such that a sufficiently fast liquid flow takes the air bubbles along with it into an expansion tank generally belonging to the system, which tank is needed to compensate the effects of thermal expansion of the liquid.

With long main piping the pressure between the output channels and return channels can be of a significantly different magnitude, according to how far from the pump the inspection point is situated. Owing to this the liquid flow might have to be configured to be correct for a specific device by means of device-specific valves. Device-specific valves are generally also needed so that in a servicing situation it would be possible to detach a device without emptying the whole amount of liquid contained in the piping.

When starting up the system the liquid contained in the piping can be too cold for circulating inside a device, e.g. owing to the danger of condensation. In these types of situations it may be necessary to arrange a bypass flow by means of a so-called 3-way valve, in which case initially only a part of the cold liquid circulates inside a device, and the flow is controlled to be full only when the liquid has warmed up sufficiently.

SUMMARY OF THE INVENTION

The purpose of this invention is to achieve a new type of liquid cooling arrangement, by means of which the drawbacks of prior art solutions are avoided. The aim is achieved with the arrangement according to the invention, which is characterized by what is stated in the characterization part of the independent claim. Other preferred embodiments of the invention are the objects of the dependent claims.

The application point of the invention is an entity that can comprise one or more devices to be cooled with a liquid. One such is e.g. a high-powered frequency converter, which comprises a number of liquid-cooled power modules, such as inverter units, connected in parallel.

What is characteristic of the invention is that the entity to be cooled is smaller than the enclosure array system according to prior art, e.g. only one equipment enclosure, in which is situated in the bottom part a pump and a liquid container and in the top part a number of small-sized power units to be cooled. Owing to the short piping structure, the pressure needed for circulating the liquid is low, owing to which the danger of a liquid leak in seals and pipe joints is smaller than in a high-pressure system according to prior art. Owing to the arrangement, essentially the whole amount of liquid contained by the apparatus can be drained to the bottom part of the enclosure by opening only one discharge valve, in which case replacement of a power unit in a servicing situation succeeds without the shut-off valves specific to a power unit that are required by prior art.

What is also characteristic of the invention is that dynamic pressure losses in distribution channels and in the power units to be cooled are configured, via the shaping of the channels, to be such that the magnitude of the internal flow of a power unit does not depend on the position in which the unit is located in the system. Owing to this, adjustment of the device-specific flow according to prior art by means of a valve is unnecessary.

What is also characteristic of the invention is that the speed of rotation of the pump, and thus also the liquid flow, can be adjusted e.g. by controlling with a frequency converter the drive motor rotating the pump. According to the invention the speed of rotation is adjusted according to the cooling requirement, i.e. on the basis of a temperature measured from one or more of the devices to be cooled. The adjustment means can be a separate logic or one of the devices to be cooled can function as such, e.g. an inverter unit of a frequency converter having sufficient capacity in the control unit to also handle the functions required by cooling.

Owing to the small power requirement and the low operating pressure, the liquid cooling apparatus according to the invention is inexpensive in terms of its costs and its susceptibility to failure is low. Low-powered pumps are almost maintenance-free, because they do not need the shaft seals required by large pumps. As a result of the invention it is possible to implement a fully enclosed device structure, the parts disposed inside which are cooled with just water, protected from the possible corrosive effects, and other such effects, of the air surrounding the device.

SHORT DESCRIPTION OF THE DRAWINGS

Figure 2:
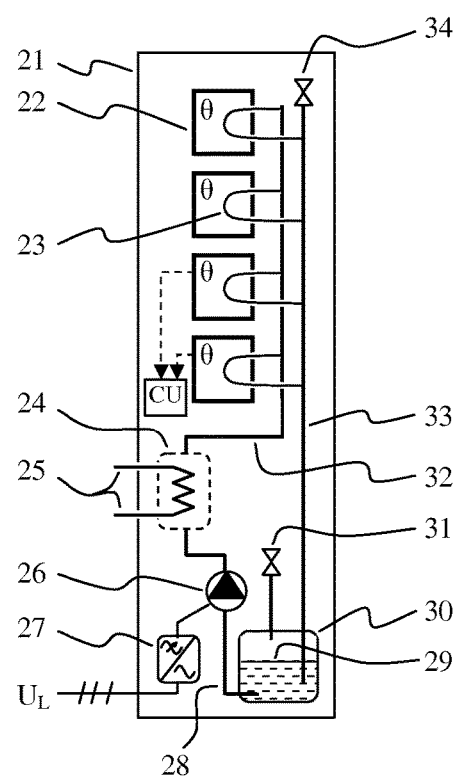

In the following, the invention will be described in more detail by the aid some embodiments with reference to the attached drawings, wherein FIG. 1 describes an example of a liquid cooling solution according to prior art, and FIG. 2 presents a liquid cooling solution according to the invention.

DETAILED DESCRIPTION OF THE INVENTION

FIG. 1 describes a solution according to prior art, of the type that is used for cooling power electronics devices with a liquid, such as with water. In the solution the devices 12 to be cooled are disposed in equipment enclosures 11, according to the figure generally each device in its own enclosure. The liquid cooling the devices circulates from the main piping 16 situated in the bottom part of the row of enclosures via the valves 15 via device-specific connection pipings 14 to the internal cooling circulation 13 of the device. By means of the valves 15 a device 12 can be detached from the liquid circulation, e.g. during servicing, without emptying the whole system of liquid. The symbol 17 describes a motor-pump combination, which circulates liquid via the main piping 16 into the heat exchanger 19, via which heat is transferred e.g. into an external liquid circulation 18. The drive motor of the pump 17 is most usually connected according to the figure directly to the electricity network $U_L$, in which case its speed of rotation is constant, determined by the frequency of the network. In a starting situation the cooling liquid can be so cold that it contributes to the condensation of water contained in the air surrounding the devices, for which reason it can be necessary to reduce the strength of the liquid circulation by means of a three-way valve 20, which guides some of the liquid flow past the device until the liquid has warmed sufficiently.

In the centralized system according to FIG. 1, the pump must be very efficient for ensuring adequate liquid circulation in all the devices. The pump 17 forms high pressure, which brings about a strong liquid circulation in the main channeling 16, the branch flows taken from which might have to be adjusted with valves 15 to be suitable for the specific device. The efficacy of the liquid cooling requires that no air bubbles remain in the internal cooling piping 13 of the devices. Removing the bubbles, i.e. venting, requires that a so-called venting screw is disposed in each device or that there is a sufficiently strong flow through them. An arrangement (not presented) for venting the main piping can be disposed e.g. in the proximity of the pump.

FIG. 2 presents a liquid cooling solution according to the present invention. In it the pump and its drive motor 26 cool a smaller entity, according to the figure e.g. only the devices 22 disposed in one equipment enclosure 21.

According to the invention the system comprises a liquid container 30, from which the pump 26 sucks liquid via the suction pipe into the heat exchanger 24, which in terms of its type can be a liquid-air exchanger or according to the figure a liquid-liquid exchanger, in which case heat is transferred into an external liquid circulation 25. From the heat exchanger the liquid displaces into the output channel 32, onwards into the internal cooling channels 23 of the devices 22 and finally via the return pipe 33 back into the liquid container. The amount of the liquid of the system is configured to be such the ends of both the suction pipe 28 and the return pipe 23 are always situated below the liquid surface 29, in which case air bubbles possibly included in the liquid circulation travel finally to outside the circulation into the air space situated in the top part of the liquid container, which air space functions as an expansion tank compensating the effects of thermal expansion of the liquid. The pressure of the container is the same as in the environment normally owing to the valve 31 being open.

According to the invention the dynamic pressure losses of the main channels 32, 23 is configured to be very small compared to the pressure losses of the internal cooling channels 23 of the devices 22 (via, inter alia, the shaping and cross-sectional areas of the channels). Owing to the arrangement, the devices are in an equal state from the viewpoint of cooling efficiency regardless of the position in which they are situated. Owing to the spacious channeling, also the internal pressure of it is low, which reduces the risk of a liquid leak.

According to the invention the speed of rotation of the drive motor 26 of the pump, and thus also the strength of the liquid flow, is controlled according to the cooling requirement e.g. by means of a frequency converter 27. The logic controlling the liquid flow can be a separate control unit CU that is common to all the devices to be cooled, which control unit monitors the temperatures $\theta$ of the devices or of their structural units and on the basis of them sends a signal (not presented) controlling the speed of rotation of the pump to the control device of the drive motor 26, e.g. to the frequency converter 27, or one of the devices 22 to be cooled can in a corresponding manner control the liquid flow on the basis of its own internal measurement of temperature. These signalings and control arrangements relating to the measurement of temperatures and to the control of the speed of rotation are obvious to a person skilled in the art and so, for the sake of the clarity of the figure, are not presented here. Owing to the control of the liquid flow, the use of a three-way valve according to prior art is unnecessary.

For a servicing situation, according to the invention a discharge valve 34 is arranged in the topmost point of the piping, e.g. according to the figure in the return pipe 33, or in a separate venting pipe, via which discharge valve air can be let into the piping for draining the liquid contained in the devices and in the piping down into the container 30. When the discharge valve is closed the liquid stays inside the piping and the devices owing to hydrostatic pressure even if the pump stops, because the ends of both the suction pipe 28 and the return pipe 33 are below the liquid surface 29.

It is obvious to the person skilled in the art that the different embodiments of the invention are not limited solely to the example described above, but that they may be varied within the scope of the claims presented below.

The characteristic features possibly presented in the description in conjunction with other characteristic features can if necessary be used separately to each other.

The invention claimed is:

1. An arrangement for cooling, with liquid, one or more electrical devices or structural units of an electrical device that is/are in at least one installation enclosure, which arrangement comprises a suction channel (32) and a return channel (33) for distributing the liquid to the one or more electrical devices (22) to be cooled or to the structural units of the one or more electrical devices, a liquid container (30), which is connected to the return channel (33) directly and to the suction channel (32) via a second suction channel (28), a pump and a heat exchanger (24), and a shut-off valve (34)

being operatively connected to the return channel (33) and being positioned at an uppermost point of the return channel (33),
wherein the liquid container (30) is disposed below the one or more electrical devices (22) to be cooled or structural units of the one or more electrical devices (22) to be cooled, and
an amount of liquid to be contained in the arrangement is configured to be such that ends of both the second suction channel (28) and the return channel (33) that are inside the liquid container (30) are situated below a liquid surface (29) of the liquid container (30),
wherein the pump includes a drive motor (26), and a speed of rotation of the drive motor (26) of the pump is configured to be controlled according to a cooling requirement by monitoring a temperature of the one or more electrical devices (22) to be cooled or of the structural units of the one or more electrical devices,
wherein when the shut-off valve (34) is closed, liquid is retained within the return channel (33) due to hydrostatic pressure and a positioning of the ends of the second suction channel (28) and the return channel (33) below the liquid surface (29).

2. The arrangement according to claim 1, wherein shaping and cross-sectional area of the suction and return channels (32, 33) are arranged in such a way that allows for an internal flow to the one or more electrical devices (22) to be cooled or the structural units of the one or more electrical devices (22) to be cooled by dynamic pressure losses of the suction and return channels (32, 33) that are configured to be smaller relative to the dynamic pressure losses of an internal cooling channels of the one or more electrical devices (22) to be cooled or of their structural units regardless of the position in which the one or more electrical devices to be cooled or the structural units of the one or more electrical devices to be cooled is situated in a system.

3. The arrangement according to claim 1, wherein the speed of rotation of the drive motor (26) of the pump is configured to be controlled by means of a frequency converter (27).

4. The arrangement according to claim 1, wherein the signal controlling the speed of rotation of the drive motor (26) of the pump is configured to be formed in a separate control unit (CU) that is common to all the one or more electrical devices to be cooled or to the structural units of the one or more electrical devices to be cooled, which control unit is configured to monitor the temperatures (θ) of the one or more electrical devices (22) or of the structural units of the one or more electrical devices.

5. The arrangement according to claim 1, wherein any of the one or more electrical devices (22) to be cooled is configured to form a signal controlling the speed of rotation of the drive motor (26) of the pump on a basis of the internal measurement (θ) of temperature of any of the one or more electrical devices or the structural units of the one or more electrical devices.

6. The arrangement according to claim 1, wherein when the shut-off valve (34) is open and when the pump is inactive a whole cooling liquid content of the one or more electrical devices (22) to be cooled is able to flow to outside them.

7. The arrangement according to claim 1, wherein a cooling piping is airtight when the shut-off valve (34) is closed.

8. The arrangement according to claim 1, wherein the heat exchanger (24) is a liquid-air exchanger or a liquid-liquid exchanger.

9. The arrangement according to claim 1, wherein the arrangement is configured to cool only the one or more electrical devices (22), or structural units of them, that are disposed in one installation enclosure.

10. The arrangement according to claim 2, wherein the speed of rotation of the drive motor (26) of the pump is configured to be controlled by means of a frequency converter (27).

11. The arrangement according to claim 2, wherein the signal controlling the speed of rotation of the drive motor (26) of the pump is configured to be formed in a separate control unit (CU) that is common to all the one or more electrical devices to be cooled or to the structural units of them, which control unit is configured to monitor the temperatures (θ) of the one or more electrical devices (22) or of the structural units of the one or more electrical devices.

12. The arrangement according to claim 3, wherein the signal controlling the speed of rotation of the drive motor (26) of the pump is configured to be formed in a separate control unit (CU) that is common to all the one or more electrical devices to be cooled or to the structural units of them, which control unit is configured to monitor the temperatures (θ) of the one or more electrical devices (22) or of the structural units of the one or more electrical devices.

13. The arrangement according to claim 2, wherein any of the one or more electrical devices (22) to be cooled is configured to form a signal controlling the speed of rotation of the drive motor (26) of the pump on a basis of the internal measurement (θ) of temperature of any of the one or more electrical devices or the structural units of the one or more electrical devices.

14. The arrangement according to claim 3, wherein any of the one or more electrical devices (22) to be cooled is configured to form a signal controlling the speed of rotation of the drive motor (26) of the pump on a basis of the internal measurement (θ) of temperature of any of the one or more electrical devices or the structural units of the one or more electrical devices.

* * * * *